United States Patent
Marchenko et al.

(10) Patent No.: US 6,477,692 B1
(45) Date of Patent: Nov. 5, 2002

(54) METHOD AND APPARATUS FOR CHANNEL-ROUTING OF AN ELECTRONIC DEVICE

(75) Inventors: Alexander Marchenko, Moscow (RU); Andrey P. Plis, Moscow (RU); Eugene G. Shiro, Moscow (RU); Mikhail A. Sotnikov, Moscow (RU); Igor Topouzov, Moscow (RU); Patrick McGuiness, Asutin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/355,144
(22) PCT Filed: Jan. 23, 1997
(86) PCT No.: PCT/RU97/00009
  § 371 (c)(1),
  (2), (4) Date: Jul. 22, 1999
(87) PCT Pub. No.: WO98/33133
  PCT Pub. Date: Jul. 3, 1998

(51) Int. Cl.[7] .............................................. G06F 17/50
(52) U.S. Cl. ............................................. 716/14; 716/2
(58) Field of Search ........................... 716/1, 2, 12, 13, 716/14, 15, 10

(56) References Cited

U.S. PATENT DOCUMENTS

| | | | |
|---|---|---|---|
| 4,965,739 A | * 10/1990 | Ng | 364/491 |
| 5,272,645 A | * 12/1993 | Kawakami et al. | 364/491 |
| 5,295,082 A | *  3/1994 | Chang et al. | 364/490 |
| 5,353,235 A | * 10/1994 | Do et al. | 364/391 |
| 5,841,664 A | * 11/1998 | Cai et al. | 364/490 |

OTHER PUBLICATIONS

Chiluvuri et al., "New Routing and Compaction Strategies for Yield Enhancement," 1992 IEEE International Workshop on Defect and Fault Tolerance in VLSI Systems, pp. 325–334.*

Gidwani et al., "MISER: An Integrated Three Layer Gridless Channel Router and Compactor," 27th ACM/IEEE Design Automation Conference, 1990, Paper 42.1, pp. 698–703.*

Kuo, "YOR: A Yield–Optimizing Routing Algorithm by Minimizing Critical Ares and Vias," IEEE Transactions on Computer–Aided Design of Integrated Circuits and Systems, vol. 12, No. 9, 1993, pp. 1303–1311.*

Preas, "Channel Routing With Non–Terminal Doglegs," 1990 Design Automation Conference, pp. 451–458.*

* cited by examiner

*Primary Examiner*—Matthew Smith
*Assistant Examiner*—Leigh Marie Garbowski

(57) ABSTRACT

The invention concerns a method for manufacturing an electronic device having a channel. The channel has a number of rows and columns for wiring of nets. Usually each wiring layer is dedicated to either the rows or the columns. According to this method certain row segments can be shifted from one wiring layer to another, so that the channel area is used more effectively.

8 Claims, 6 Drawing Sheets

{2-6}

{4-6}

{5-6}

{5-4}

METHOD AND APPARATUS FOR CHANNEL-ROUTING OF AN ELECTRONIC DEVICE

FIELD OF THE INVENTION

This invention relates generally to the field of manufacturing of electronic devices, such as semiconductors or printed circuit boards, and more particularly to routing of a channel in such an electronic device.

BACKGROUND OF THE INVENTION

Routing has been used extensively mainly in the layout of integrated circuits and printed circuit boards in the prior art. A channel router is designed to route nets that interconnect terminals on two opposite sides of a rectangular region called the channel. Most of the channel routers assume that only two layers are available for interconnection and that the components of routed nets is horizontal and vertical segments. In such prior art routers segments in a specific direction—for example horizontal—are run on one layer and segments in the other direction are run on the other layer.

Terminals are placed at regular intervals and identify the columns of the channel. Horizontal segments are placed so that design rules are not violated. These constraints also identify the rows of the channel. When a net is broken into two or more horizontal segment occupying different rows a technique called "doglegging" is used in the prior art. Doglegging is effective to reduce the number of rows of the channel but it requires additional vias. One example for such a channel router is given in James Reed, Alberto Sangiovanni-Vincentelli, "A new symbolic router: YACR2", IEEE Transactions on Computer-Aided Design, Vol. CAD-4, No. 3, 1985, pp. 208–219.

A channel router must take into consideration vertical constraints. A vertical constraint is a constraint that exists when two nets each have a terminal in the same column. All the vertical constraints that exist for a given channel are usually modeled in a vertical constraint graph (VCG): A VCG is a graph whose nodes represent nets and whose edges represent vertical constraints.

From Bryan Preas, "Channel Routing with non-terminal Doglegs", Proc. The European Design Automation Conference, Glasgow, Scotland, 1990, pp. 451–458, a channel router is known for resolving cyclic vertical constraints. This guarantees the completion of the required interconnections in the channel. The algorithm of this router resolves cyclic constraints by adding non-terminal doglegs to enough wire segments to break all of the constraint cycles. The altered wire segments and the resulting acyclic constraint graph are used as input to an ordinary constraint-based channel router.

The goal of a channel router is to complete the interconnections in a minimum area. Also the number of through vias and lengths of nets are important to evaluate the quality of the routing. The better the quality of the routing the better are the resulting characteristics of the electronic device in terms of power dissipation, operational speed, compactness of design and—in the case of semiconductors—the amount of precious silicon floor space required.

Therefore this invention seeks to provide an improved method for manufacturing an electronic device as well as an improved method for optimizing a routing of a channel by means of a program as well as an enhanced electronic device having a channel.

SUMMARY OF THE INVENTION

The underlying problem of the invention is solved basically by applying the features laid down in the independent claims. The invention is particularly advantageous in that it allows the design of an electronic device that has a maximum local density in its channel which is greater than the number of rows in the channel. This feature can not be realized by any of the prior art channel routers. This allows more efficient utilization of a channel region and a denser wiring structure. Thereby the overall length of the nets is reduced as well as the size of the channel.

These advantages can be crucial for the performance of an electronic device produced according to a manufacturing method of the invention. The shrinkage of the channel region allows a more compact design of the device and to integrate more functionalities within the same space. Also because of the shorter wire length time delays due to signal propagation over the channel are reduced so that the overall operational speed of the electronic device is increased.

For clocked electronic devices this particular advantage of the invention allows to increase the clock frequency. As a further advantage the invention allows also to reduce the power dissipation of an electronic device by optimization of the channel routing. If the routing length of the channel is reduced according to a method for optimizing of the invention this typically results in reduced power dissipation due to the shortened wire length.

According to a preferred embodiment of the invention the row and column segments do not have to be straight lines but can have any curved shape. The routing method of the invention has to advantage to be able to process also such arbitrarily shaped routes.

DETAILED DESCRIPTION OF A PREFERRED EMBODIMENT

Figure 1:
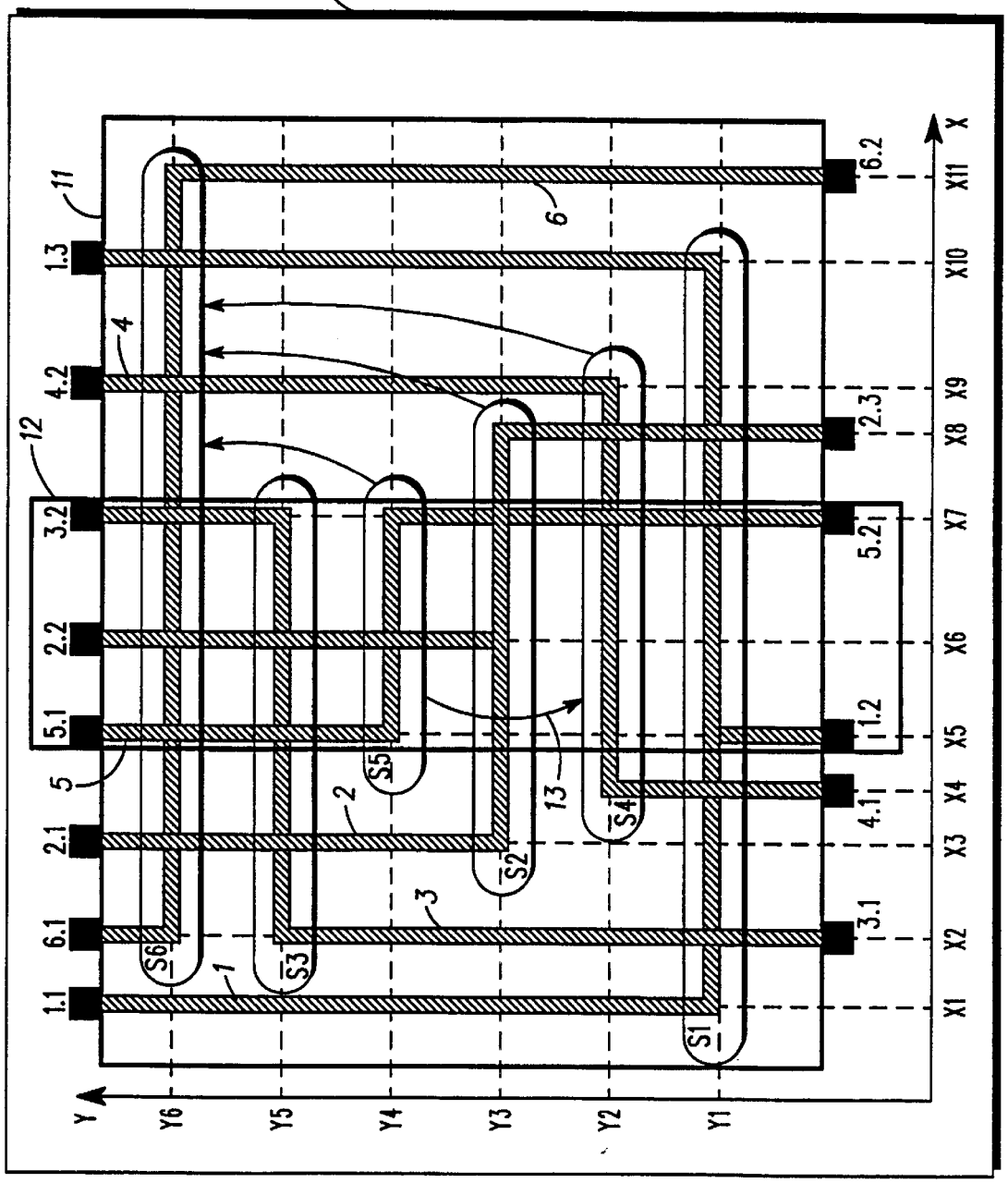
FIG. 1. shows the channel region of an electronic device having wiring in rows and columns.

FIG. 1 shows an electronic device 10 which is designed and fabricated according to the prior art. The electronic device 10 has a channel 11 with terminals at irregular intervals on two opposite sides, the top and bottom of the channel 11. The channel 11 contains the wiring for nets 1 to 6. The net 1 has its terminals that are designated by reference numerals 1.1 and 1.3 situated on top of the channel 11 whereas the terminal 1.2 of net 1 is situated on the bottom of the channel 11.

The net 2 has its terminal 2.1 and 2.2 situated on top of the channel 11 and its terminal 2.3 at the bottom. The net 3 has its terminal 3.2 at the top and its terminal 3.1 at the bottom; the net 4 has its terminal 4.2 at the top and its terminal 4.1 at the bottom; the net 5 has its terminal 5.1 at the top and its terminal 5.2 at the bottom and the net 6 has its terminal 6.1 at the top and its terminal 6.2 at the bottom of the channel 11.

According to the fabrication process employed to produce the electronic device 10 all the segments of the nets 1 to 6 which run into the column direction Y are implemented on a wiring layer different from the wiring layer of the segments of the nets which run into a row direction X. At the transitions from column to row segments and vice versa the segments are interconnected by through vias which are not shown in the drawing for simplicity.

Within region 12 the channel 11 has its zone of maximum local density. Generally the maximum local density is defined as the maximum number of parallel row segments that can be found in the channel. In other words: The maximum local density is the maximum number of net connections required to cross a column of the channel". For the case of the channel 11 considered here the local density of the channel wiring is at a maximum between the positions X5 and X7 along the row axis X.

According to the prior art row and column segments have to be placed on different wiring layers in order to prevent undesired net connection—or in other words—short circuits between nets. As a consequence the maximum local density of an electronic device designed and produced according to the principles of the prior art can never exceed the number of available rows in the channel. For the case of the channel 11 considered in this example there are six rows available for the implementation of row segments at the positions Y1 to Y6 on the column direction axis Y.

In the case considered here the maximum local density does also equal six since six net connections are needed to route across zone 12, which is the zone of maximum local density. The addition of another row segment across zone 12 is not possible using only six rows without causing short circuits according to the prior art. Therefore six is the theoretical minimum for routing rows needed for wiring in channel 11 when prior art routers are employed. Hence, the number of available rows which is six is the theoretical maximum for the maximum local density of the wiring in channel 11 when prior art routers are employed.

Figure 2:
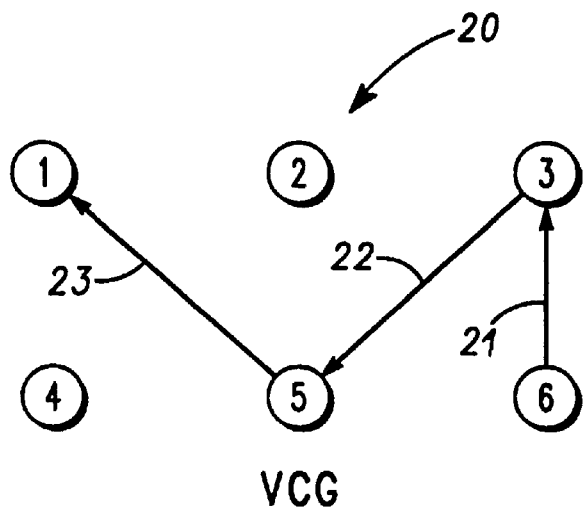
FIG. 2 is a vertical constraint graph of the channel shown in FIG. 1.

FIG. 2 shows a so called vertical constraint graph (VCG) 20 of the channel 11 of FIG. 1. The nodes 1 to 6 of the graph 20 represent the nets 1 to 6 of FIG. 1. The edges 21, 22 and 23 of the vertical constraint graph 20 represent vertical constraints that exist between different nets in the channel 11.

A directed edge from node i to node j in graph 20 means that there is one terminal of the net i placed on top of the channel 11 and opposite to a terminal of net j placed on the bottom of channel 11. Hence the edge 21 represents the vertical constraint that is caused by the terminals 6.1 and 3.1 which are situated on opposite positions along the channel 11 within the same column X2.

Likewise, the edge 22 represents the vertical constraint which is caused by the terminal 3.2 and 5.2 whereas the edge 23 which points from node 5 to node 1 represents the vertical constraint caused by the positions of the terminals 5.1 and 1.2. To resolve the vertical constraints as modeled by the graph 20 doglegging was used. The design of the wiring of the channel 11 resulted therefrom.

Figure 3:
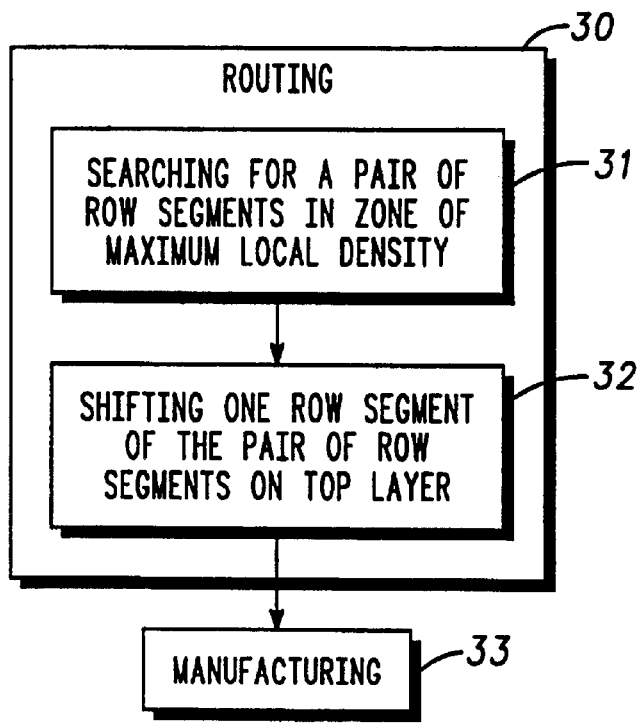
FIG. 3 is a flow chart of one embodiment of the method for manufacturing an electronic device of the invention.

FIG. 3 shows one embodiment of the method for manufacturing an electronic device according to the invention. First step of routing the electronic device designates the design phase. A routing of the type as explained with respect to FIG. 1 and 2 can be delivered by non design tools.

In steps 31 and 32 of the design step 30 such a routing is optimized: in step 31 a pair of row segments of different ones of the nets to be routed are searched within the zone of maximum local density of the channel. Both row segments have to be situated at least partially within the zone of maximum local density.

Possible pairs of row segments are the segments (S5, S6), (S2, S6), (S4, S6), and (S5, S4) in the routing of the channel 11—by way of example. Also by way of example the pair of segments (S5, S4) is selected from the available pairs.

In step 32 one row segment of the pair identified in step 31 is shifted in a column direction above the other row segment of the same pair if one assumes that the row segments are normally implemented in the bottom wiring layer and the column segments in the top wiring layer. In the case considered here this means that the segment S5 is moved on top of the segment S4 along the column direction Y. This is symbolized by the arrow 13 in FIG. 1.

Figure 11:
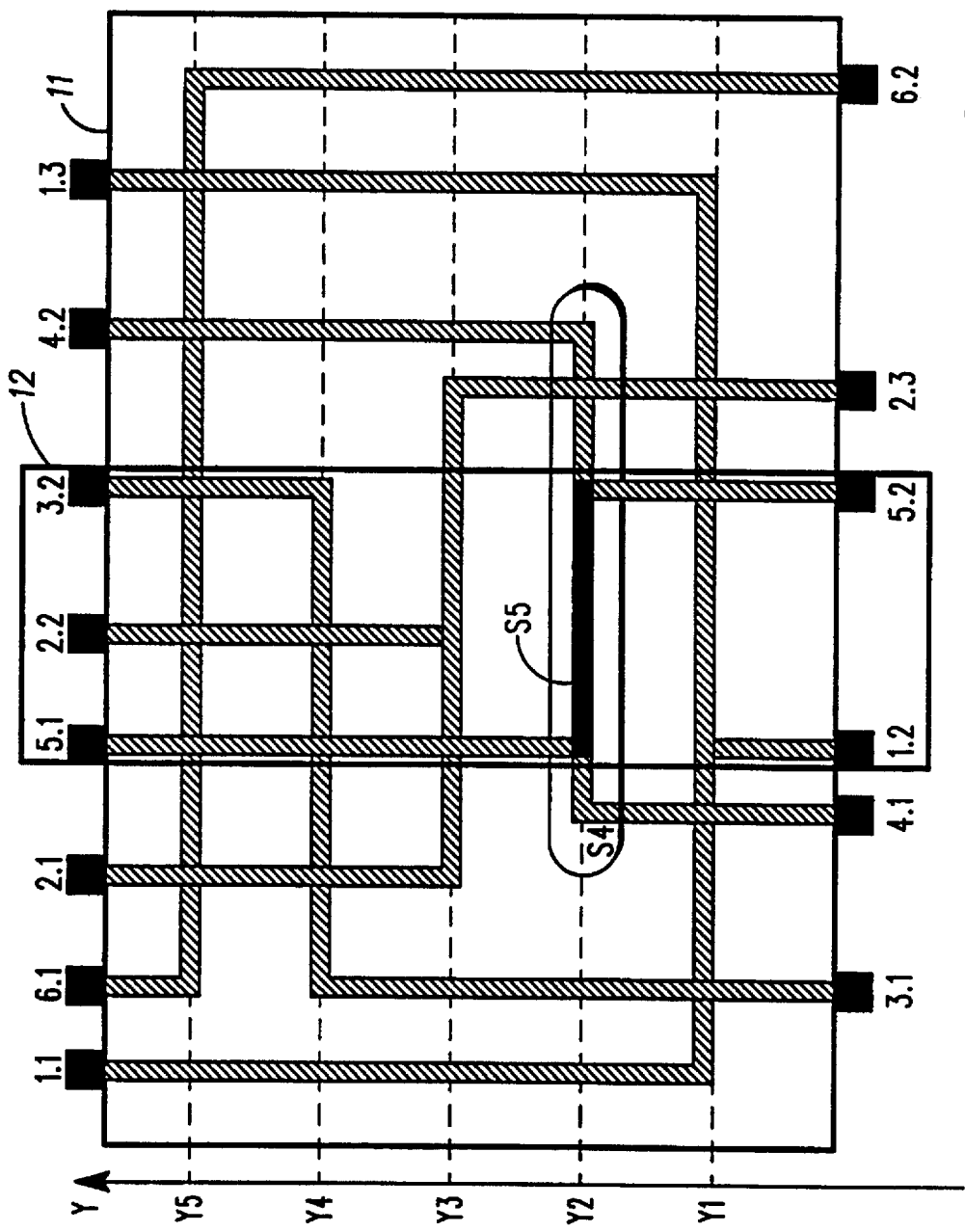
FIG. 11 is a circuit diagram of the resulting optimized channel routing.

When the segment S5 is shifted on top of the segment S4, the row Y4 becomes superfluous since it does not contain. a row segment any more. Hence, by placing the row segment S5 on top of the row segment S4 the row Y4 is available for other purposes or can be left away so that the channel width shrinks from 6 to 5 rows. The result of this operation is shown in FIG. 11 having placed the row segment S5 above the row segment S4.

Based on the design of the routing performed in step 30 the electronic device is fabricated in step 33 by manufacturing row segments and column segments to implement the routing of the channel. For this step 33 of manufacturing known lithography or other suitable technologies can be used.

Figure 4:
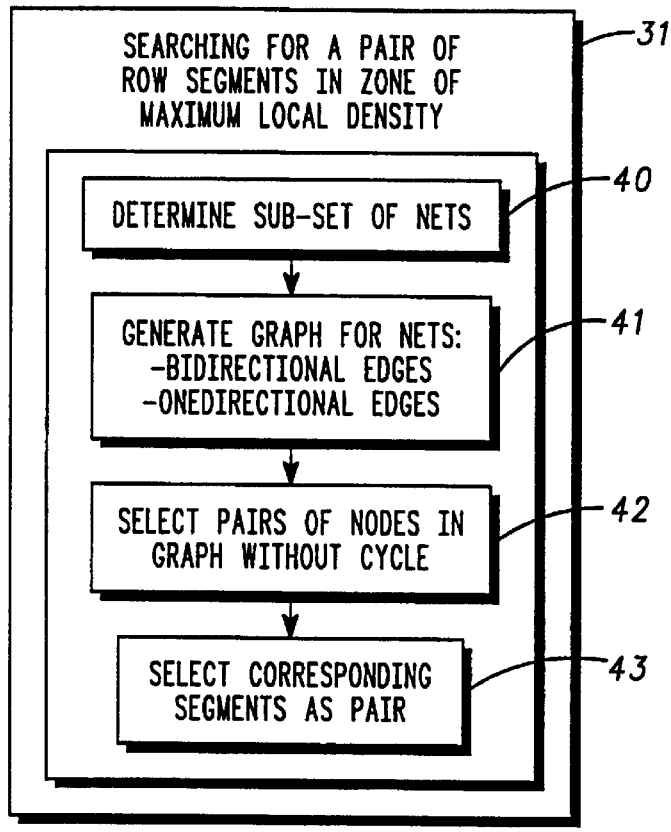
FIG. 4 is a flow chart illustrating the first step in the method of FIG. 3 in more detail.

FIG. 4 is a flow diagram to explain in more detail one embodiment of the step 31 of searching for a pair of row segments in the zone of maximum local density (cf. FIG. 3). In step 40 a subset of nets is determined whereby each of the nets in this subset has at least one terminal within the zone of maximum local density. In the example shown in FIG. 1 the terminals 1.2; 2.2; 3.2; 5.1 and 5.2 are situated in the region 12 which is the zone of maximum local density of the channel 11. As a consequence the nets 1, 2, 3 and 5 belong to the subset of nets determined in step 40 for the example of FIG. 1.

For all of the nets that are present in the channel of the electronic device to be manufactured a graph is generated in step 41. Each node in this graph is representative of one of the nets.

Figure 6:
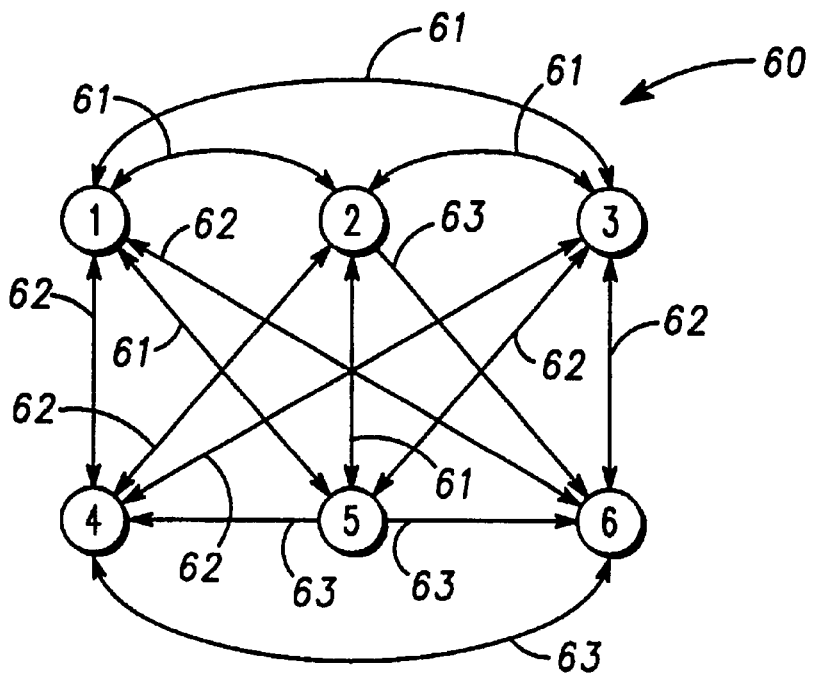
FIG. 6 is a graph for determining row segments to be shifted.

For the example of FIG. 1 this correspondents to the nodes 1 to 6 in graph 60 of FIG. 6.

With respect to FIG. 4, all the nodes which are representative of nets belonging to the subset of nets determined in step 40 are interconnected in the graph which is generated in step 41 by bi-directional edges. Further unidirectional edges are added to the graph that is generated in step 41. To determine which of the nodes in the graph has to be interconnected by such unidirectional edge each one of the nodes in the graph is selected consecutively for processing.

For the processing of a particular node of the graph first the leftmost terminal of the net which is represented by the selected node is determined. Further the terminals of other nets that are situated to the right with respect to the leftmost terminal are determined. Only those terminals are taken into consideration which are positioned within a row segment of the selected net. In other words: Only such terminals are relevant in this processing step that are situated within a column X that intersects a row segment of the selected net.

A set of terminals which satisfy those conditions are relevant for determining which of the nodes of the graph are to be interconnected to the selected node by a unidirectional edge. This means that for each terminal satisfying the above described conditions the corresponding node in the graph which is representative of the net to which the specific terminal belongs is interconnected with the selected node by a unidirectional edge pointing towards the selected node.

In the preferred embodiment considered here such edges are not added between the nodes that have already been interconnected by bi-directional edges before. This is the case for the nodes that are representative of the subset of nets determined in step 40. If there already is a bi-directional edge interconnecting two nodes in the graph the addition of a further unidirectional edge does not add further valuable information to the graph.

After the processing of the selected node another node is selected and the same procedure is carried out for the new selected node until all nodes had been selected once for processing.

Considering now the example as shown in FIG. 1 and 6 the following procedure is carried out in step 41 in order to add additional unidirectional edges to the graph 60.

First the node 1 is selected in the graph 60. The leftmost terminal of the node 1 in the row direction X is the terminal 1.1. The net 1 has horizontal row segment S1 which intersects the columns from the position X1 to X10. All the terminals of other nets that are situated within one of the columns between the positions X1 and X10 of the row segment S1 of the net 1 are potentially relevant to determine additional unidirectional edges. These are the terminals (in the row direction X) 6.1, 3.1, 2.1, 4.1, 5.1, 2.2, 3.2, 5.2, 2.3 and 4.2.

In the preferred embodiment considered here those terminals belonging to nets of the subset of nets determined in step 41 are not taken into consideration with respect to node 1 since the corresponding nodes in graph 60 have already been interconnected by bi-directional edges in step 41. As a consequence only the terminals 6.1 and 4.1 of the nets 4 and 6 which do not belong to the subset of nets are relevant. As a consequence two additional unidirectional edges are added to the graph 60 between the nodes 4 and 1 as well as between 6 and 1, both unidirectional edges pointing towards the selected node 1.

Likewise, in the next step of the procedure the node 2 of the graph 60 is selected. The leftmost terminal of the net 2 which the node 2 represents is the terminal 2.1. A corresponding row segment of the net 2 is the segment S2 between the positions X3 and X8. As a consequence all terminals situated within a column between the positions X3 and X8 are potentially relevant. These are the terminals 4.1, 5.1, 1.2, 3.2 and 5.2. Those terminals of the potentially relevant terminals which belong to nets of the subset of nets are again disregarded since the net 2 also belongs to the subset so that the corresponding nodes have also been interconnected by bi-directional edges in the graph. As a consequence only the terminal 4.1 is of relevance so that a unidirectional edge from the node 4 to the selected node 2 is added in the graph 60.

In the next step the node 3 of the graph 60 is selected. The corresponding leftmost terminal is the terminal 3.1 and the corresponding row segment is segment S3 between the positions X2 and X7. As net 3 does also belong to the subset of nets only terminal 4.1 which is situated within the column on position X4 is of relevance. As a consequence a unidirectional edge is added from node 4 to node 3 in the graph 60.

In the next step node 4 is selected. Its leftmost terminal is terminal 4.1 and the corresponding row segment is segment S4 between the positions X4 and X9. As the net 4 does not belong to a subset of nets also terminals which do belong to nets of the subset are relevant to determine additional edges. Taking the terminal 4.1 as a starting point the terminals 5.1, 1.2, 2.2, 3.2, 5.2 and 2.2 are situated along the row segment S4 within columns which intersect the row segment S4. As a consequence unidirectional edges have to be added from nodes 1, 2, 3 and 5 to the node 4.

In the next step node 5 is selected. From this selection no additional edges result since the corresponding row segment S5 does only cover terminals of nets belonging to the subset of nets to which the net 5 of the selected node 5 also belongs.

In the last step of the procedure carried out in the step 41 the node 6 is selected. The corresponding row segment is the segment S6. The net 6 does not belong to the subset of nets so that all terminals which are situated within a column intersecting the segment S6 are taken into consideration irrespective whether their corresponding nets belong to the subset or not. As a consequence the terminals 2.1, 4.1, 5.1, 1.2 and 3.2 cause the addition of unidirectional edges from the nodes 2, 4, 5, 1 and 3 to the node 6 in the graph 60.

The resulting graph 60 is shown in FIG. 6. Two unidirectional edges between the same nodes pointing into opposite directions are presented by one bi-directional edge for simplicity.

In the next step 42 of the flow chart shown in FIG. 4 pairs of nodes in the graph are selected if there is no cycle between the nodes. A cycle is present if there is a bi-directional edge between two nodes of the same graph. Hence all possible pairs of nodes are selected which are not interconnected by bi-directional edges. With respect to the example as explained with reference to FIGS. 1 and 6 this means that within the graph 60 only pairs of nodes which are interconnected by unidirectional edges 63 are selected. These are the pairs of nodes (2, 6), (4, 6), (5, 6) and (5, 4).

The selection of these pairs of nodes corresponds to a result of the step 31 of searching for a pair of row segments in the flow charts of FIG. 3 and FIG. 4 since each node within each pair represents one row segment. For example in the case of the selected pair of nodes (2, 6) these are the segments S2 and S6. In the case of the selected pair (5, 4) these are the segments S5 and S4, respectively. The pairs of segments belonging to the corresponding pairs of selected nodes are candidates for performing the shifting operation in step 32 of FIG. 3. For example the row segment S2 can be shifted in the column direction Y and placed on the row Y6 which is the same row of the row segment S6 but onto a different wiring layer. However this is not always advisable since undesired net connections can result.

In this example it is not possible to shift the row segment S2 above S6 without producing undesired net connections in the wiring layer which normally is only used for the wiring in the column direction Y. For example short circuits with the nets 5, 2 and 3 would result in this example. Hence the shifting operation can not be performed with respect to the selected pair of segments belonging to the selected pairs of nodes (2, 6).

By way of example the selected pair of nodes (5, 4) is considered in the following. The corresponding row segments are the segments S5 and S4. When the segment S5 is shifted above the row segment S4 in the column direction Y as indicated by the arrow 13, this is possible without causing any conflict with the wiring in the column direction. Hence it is possible to displace the segment S5 from the row Y4 to the row Y2 on top of the row segment S4 without disturbing the signal integrity of the nets. The result of this shifting operation is shown in FIG. 11.

In order to make the selection of pairs of row segments of step 43 more reliable the step 43 advantageously is carried out according to the procedure which will be described in the following with reference to FIG. 5.

In step 50 an additional graph is generated for each of the pairs of nodes selected in step 42 of FIG. 4. If a specific one of these pairs of nodes is considered in the following, first one node of the nodes of the specific one of the pairs of nodes is selected in step 51. The selected node is always the node from which the unidirectional edge which interconnects the two nodes of this considered pair of nodes is pointing. This selection is performed in the vertical constraint graph of the channel to be routed which forms a basis of all of the additional graphs to be generated in step 50.

In the following additional unidirectional edges are added to the vertical constraint graph for the pairs of nodes considered here in step 52. The nodes to be interconnected by additional edges are selected according to the following procedure:

The leftmost terminal of the net which is represented by the node selected in step 51 is taken as a starting point. All nodes of nets which have a terminal to the right with respect to the leftmost terminal of the net belonging to the selected node have to be interconnected with the selected node by a unidirectional edge for each such terminal. Again, this applies only to such terminals which are situated within a column which is intersected by a row segment of the net being represented by the selected node. Terminals which are situated on opposite sides of the channel result in unidirectional edges having opposite directions with respect to the selected node in the additional graph.

In the next step of the procedure of adding additional edges in step 52, the other node of the same selected pair of nodes is taken as a starting point:

All interconnections, which exist from this node to the other nodes in the vertical constraint graph also have to be established from the selected node of the pair of nodes considered here. For example, if the other node in the selected pair has unidirectional edges to or from the nodes i and j, then the selected node of the pair of nodes considered has to be connected in the same way to the same nodes i and j by means of additional unidirectional edges, pointing into the same direction with respect to the nodes i and j.

This procedure is carried out for all of the pairs of nodes, which are selected in step 42 of FIG. 4. According to a preferred embodiment a pair of unidirectional edges interconnecting the same nodes but pointing into opposite directions are combined to be represented by one bi-directional edge. In step 53 the additional graphs which are generated in step 50 are analyzed for cycles: Again, a cycle exists in the graph if there is a bi-directional edge between at least two of the nodes of the graph. Only such graphs of the additional graphs are selected which do not have such cycles. The selected graphs are representative of the pairs of nodes which correspond to row segments to be shifted in step 32 of FIG. 3.

Figure 7:
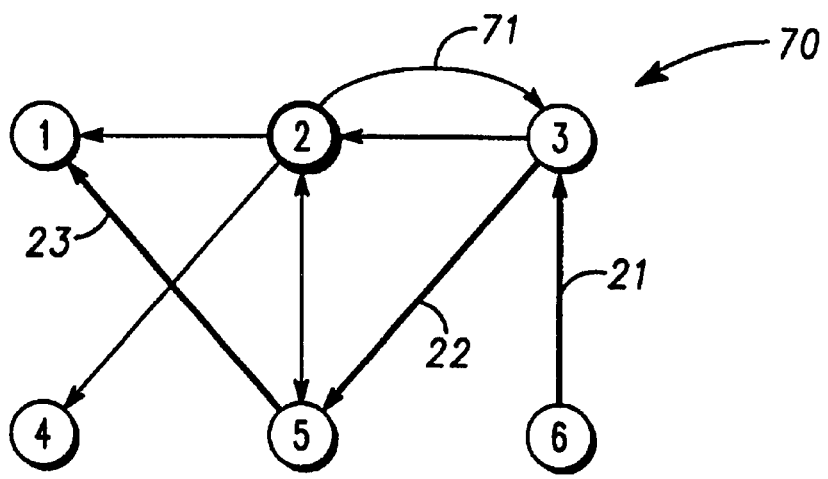
FIG. 7 to FIG. 10 show additional graphs used for selecting row segments to be shifted.

This will be explained in more detail with respect to FIGS. 7, 8, 9 and 10 by way of the example shown in FIG. 1. FIG. 7 shows additional graph 70 which is generated in step 50 of FIG. 5 for the selected pairs of nodes (2, 6). The additional graph 70 initially consists of the vertical constraint graph, shown in FIG. 2 with the corresponding edges 21, 22 and 23. The node 2 in the graph 70 is selected from the pairs of nodes (2, 6) since it is the node 2 from which the unidirectional edge 63 interconnecting the nodes 2 and 6 in the graph 60 of FIG. 6 originates.

Next, in step 52 additional edges are added to the graph. The leftmost terminal 2.1 of the net 2 which is represented by the selected node in the pairs of nodes (2, 6) is used to determine the required additional interconnections and their direction. With respect to the leftmost terminal 2.1 the nets 4, 5, 1 and 3 have one or more terminals to the right.

If one proceeds along the row segment S2 which belongs to the leftmost terminal 2.1 along the row direction X, the first terminal encountered is the terminal 4.1, which is situated on the bottom of the channel 11. As a consequence the nodes 2 and 4 are interconnected by a unidirectional edge which points from the node 2 to node 4. Another convention for the sense of direction of the edge is also possible provided that edges which are caused by terminals situated on different sides of the channel have opposite directions.

The next two terminals encountered when one proceeds further into the row direction X are the terminals 5.1 and 1.2 at the position X5. Since 5.1 is situated on top, the corresponding unidirectional edge which is added between node 5 and node 2 points from node 5 to node 2.

Likewise the additional edge between nodes 2 and 1 points from node 2 to node 1 since the terminal 1.2 is situated on the bottom of the channel 11. The next terminals of other nets encountered in the row direction X are the terminals 3.2 and 5.2 situated on the top and the bottom, respectively. As a consequence additional unidirectional edges result from node 3 to node 2 and from node 2 to node 5. If one proceeds further along the row segment S2 no further terminals are encountered until the end of the row segment S2 is reached.

Since the node 6 of the pairs of nodes considered is interconnected by unidirectional edge 21 to node 3, node 2 also has to be interconnected with node 3 the same way. The potential placement of net 2 in the same row as net 6 forces it to share the same vertical constraints as net 6. This is done by adding the unidirectional edge 71 between the nodes 2 and 3 which points to node 3.

Figure 8:
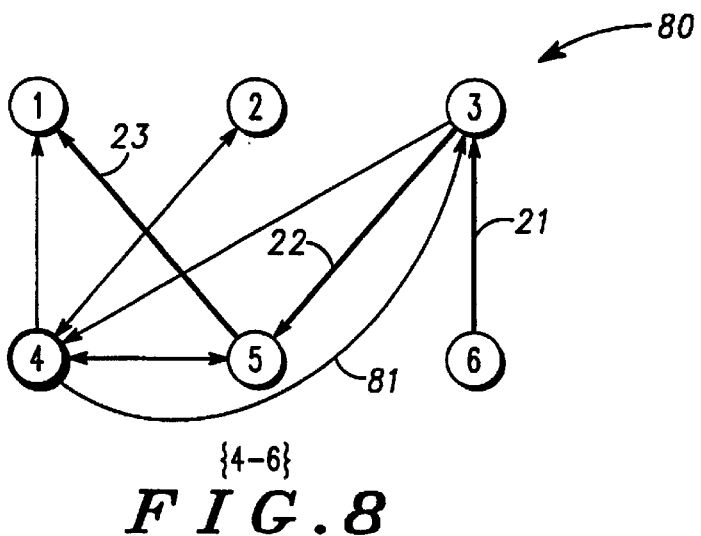

This procedure is also carried out with respect to the selected pair of nodes (4, 6) which will be explained with respect to FIG. 8. Again the vertical constraint graph shown in FIG. 2 which comprised the edges 21, 22 and 23 is taken as a basis to generate the additional graph 80 shown in FIG. 8 which is generated in step 50 of FIG. 5.

Since the unidirectional edge between nodes 4 and 6 in the graph 60 of FIG. 6 points from node 4 to node 6, the node 4 is the selected node in the pair of nodes (4, 6). Again the leftmost terminal of the net 4 which is represented by the node 4 is taken as a starting point. The leftmost terminal is the terminal 4.1 for this case.

If one proceeds along the corresponding row segment S4 along the row direction X the terminals encountered on the bottom of the channel 11 are the terminals 1.2, 5.2 and 2.3, whereas the terminals encountered on the top are the terminals 5.1, 2.2, 3.2. Each of these terminals results an additional unidirectional edge in the graph. If the terminal is on the same side of the channel 11 as the leftmost terminal 4.1, the corresponding edge points from node 4 to the node which is representative of the net to which such a terminal belongs.

If the terminal encountered is on the other side of the channel 11, the corresponding unidirectional edge points towards the selected node 4. Again, it is also possible to reverse this convention without changing the result.

In the example considered here this means that unidirectional edges originating from the node 4 are added to interconnect the node 4 to the nodes 1, 5 and 2, whereas unidirectional edges pointing towards the node 4 are added to interconnect the nodes 5, 2 and 3 the other way round to the node 4. The node 4 is also interconnected with the node 3 by the unidirectional edge 81 since the node 6 of the pair of nodes (4, 6) is also interconnected to the node 3.

Figure 9:
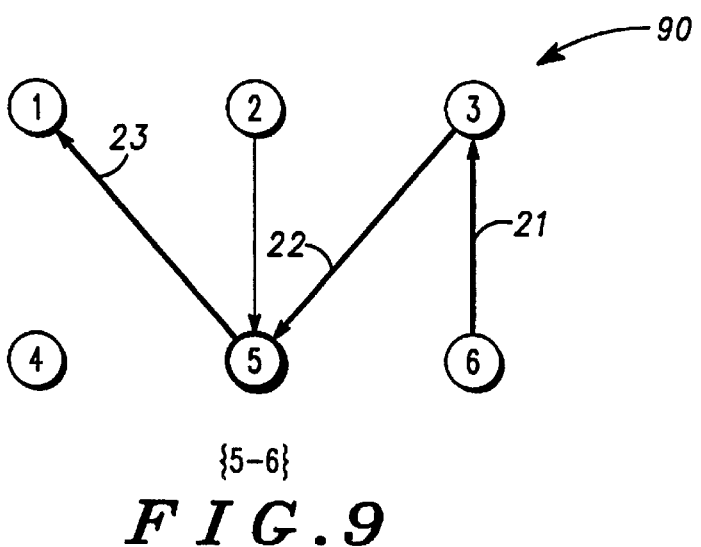
Figure 10:
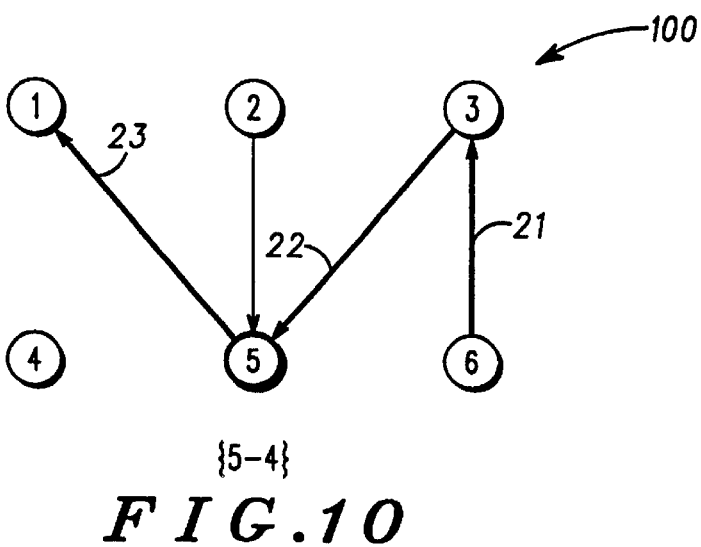

With respect to FIG. 9, in the additional graph 90 which is generated for the selected pair of nodes (5, 6) according to the same procedure only two additional unidirectional edges are added to the original vertical constraint graph between the nodes 2 and 5 as well as 3 and 5.

For the selected pair of nodes (5,4) a corresponding graph 100 is generated according to the same principles. Only one additional edge is added between the nodes 2 and 5 with respect to the original vertical constraint graph.

Figure 5:
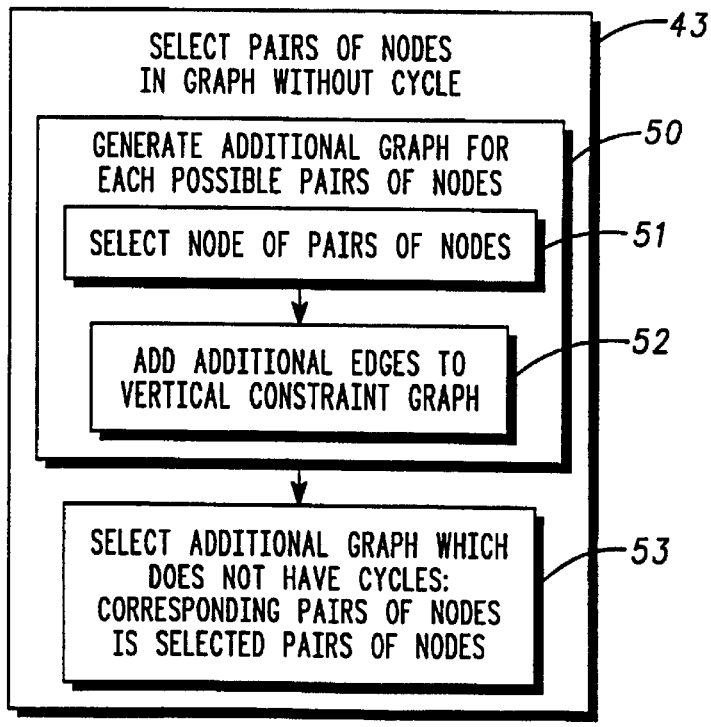
FIG. 5 is a flow chart showing the second step in the method of FIG. 3 in more detail.

In the next step 53 of the method of FIG. 5 the additional graphs of FIG. 7, 8, 9 and 10 are analyzed for cycles. Only the graph 100 of FIG. 10 which belongs to the pair of nodes (5, 4) does not have such a cycle. If no cycle is present it is guaranteed no undesired net connections result when the corresponding row segment S5 of the net 5 is shifted on top of the segment S4 in the wiring layer which is normally used only for the wiring in the column direction Y.

An alternative approach for searching row segments of different nets which can be shifted without causing short circuits is to identify two arbitrary nets X and Y which fulfill the following conditions:

a) the span of the row segment of net X is a subset of the span of the row segment of net Y;

b) no terminal of the net Y lies within the span of the row segment of net X; and c) both row segments of the nets X and Y cross the zone of maximum local density.

With respect to the routing shown in FIG. 1 this means that only the row segments S5 and S4 fulfill these conditions: The row segment S5 of net 5 spans the positions X5 to X7 whereas the row segment S4 of the net 4 spans the positions X4 to X9. Hence, condition a) is fulfilled. Also, no terminal of the net 4 lies within the span between X5 and X7 and both segments S5 and S4 are situated in the zone 12 of maximum local density. Any method to select such row segments fulfilling the above conditions can be chosen to implement the teaching of the invention.

What is claimed is:

1. A method for manufacturing an electronic device having a channel, said channel having rows and columns for wiring a number of nets, said channel having a first wiring layer for said rows and a second wiring layer for said columns, said method comprising the steps of:

a) manufacturing row segments and column segments to implement a routing of said channel, said routing being optimized in accordance with the steps of:

b) searching for at least a first row segment used in wiring a first net of the number of nets and a second row segment used in wiring a second net of the number of nets in which said first row segment and said second row segment are situated at least partially within a zone of maximum local density of said channel; and c) shifting said first row segment in a column direction to said row of said second row segment and onto said second wiring layer without producing undesired net connections in said second wiring layer;

wherein the step of searching comprises:

a1) determining a sub-set of said nets, each of said nets of said sub-set having at least one terminal within said zone of maximum local density;

a2) generating a graph for said nets, each node of said graphs being representative of one of said nets, said step of generating comprising the steps of:

a3) interconnecting said nodes being representative of said sub-set of nets by bi-directional edges;

a4) for each one of said nets:

a5) selecting a leftmost terminal of said one of said nets in a row direction;

a6) interconnecting all nodes being representative of nets having a terminal along said row direction within a column which is intersected by a row segment of said one of said nets by an unidirectional edge, said unidirectional edge being directed towards said node being representative of said one of said nets;

a7) selecting pairs of said nodes of said graph which are only interconnected by one unidirectional edge;

a8) for each one of said pairs of said nodes:

a9) selecting said row segment of said net being represented by said node of said one of said pairs of nodes from which said unidirectional edge originates as a first row segment and selecting said row segment of said net being represented by said other node of said one of said pairs of nodes as a second row segment.

2. The method for manufacturing an electronic device according to claim 1, said routing being optimized in accordance with the further steps of:

b1) for each one of said pairs of said nodes found in step a7)

b2) generating an additional graph based on a vertical constraint graph of said channel, said step of generating comprising the steps of:

b3) selecting said node of said one of said pairs of nodes from which said unidirectional edge interconnecting said nodes of said one of said pairs of nodes originates in said graph;

b4) interconnecting all nodes of said vertical constraint graph being representative of nets having a terminal to the right with respect to a leftmost terminal of said first row segment of said net being represented by said selected node along said row direction within a column which is intersected by a row segment of said one of said nets to said selection node by an unidirectional edge for each such terminal;

b5) interconnecting all nodes to which said other node of said one of said pairs of nodes is connected in said vertical constraint graph to said selected node by the same kind of said edges as said other node;

b6) selecting said additional graph if it has no bi-directional edges; and b7) if said additional graph is selected in step b6), selecting a row segment of said net being represented by said selected node as said first row segment and a row segment of said net being represented by said other node as said second row segment.

3. A method for optimizing a routing of a channel, said channel having rows and columns, a number of nets being routed in said rows and said columns of said channel, said channel having a first wiring layer for said rows and a second wiring layer for said columns, said method comprising the steps of:

a) searching for at least a pair of row segments comprising a first row segment used in wiring a first net of the number of nets and a second row segment used in wiring a second net of the number of nets in which said first row segment and said second row segment are situated at least partially within a zone of maximum local density of said channel; and b) shifting said first row segment of said pair in a column direction to said row of said second row segment onto said second wiring layer.

wherein said step of searching comprises a1) determining a sub-set of said nets, each of said nets of said sub-set having at least one terminal within said zone of maximum local density;

a2) generating a graph for said nets, each node of said graphs being representative of one of said nets, said step of generating comprising the steps of:

a3) interconnecting said nodes being representative of said sub-set of nets by bi-directional edges;

a4) for each one of said nets:

a5) selecting a leftmost terminal of said one of said nets in a row direction;

a6) interconnecting all nodes being representative of nets having a terminal to the right with respect to said leftmost terminal along said row direction within a column which is intersected by a row segment of said one of said nets to said node being representative of said one of said nets by an unidirectional edge, said unidirectional edge being directed towards said node being representative of said one of said nets;

a7) selecting pairs of said nodes of said graph which are only interconnected by one unidirectional edge;

a8) for each one of said pairs of said nodes:

a9) selecting said row segment of said net being represented by said node of said one of said pairs of nodes from which said unidirectional edge originates as a first row segment and selecting said row segment of said net being represented by said other node of said one of said pairs of nodes as a second row segment.

4. The method according to claim 3 further comprising the steps of:

b1) for each one of said pairs of said nodes found in step a7):

b2) generating an additional graph based on a vertical constraint graph of said channel, said step of generating comprising the steps of:

b3) selecting said node of said one of said pairs of nodes from which said unidirectional edge interconnecting said nodes of said one of said pairs of nodes originates in said graph;

b4) interconnecting all nodes of said vertical constraint graph being representative of nets having a terminal to the right with respect to a leftmost terminal of said first row segment of said net being represented by said selected node along said row direction within a column which is intersected by a row segment of said one of said nets to said selected node by an unidirectional edge for each such terminal;

b5) interconnecting all nodes to which said other node of said pairs of nodes is connected in said vertical constraint graph to said selected node by the same kind of said edges as said other node;

b6) selecting said additional graph if it has not bi-directional edges; and b7) if said additional graph is selected in step b6), selecting a row segment of said net being represented by said selected node as said first row segment and a row segment of said net being represented by said other node as said second row segment.

5. A program storage device embodying a program executable by a computer to perform a method for optimizing a routing of a channel, said channel having rows and columns, a number of nets being routed in said rows and said columns of said channel, said channel having a first wiring layer for said rows and a second wiring layer for said columns, said method comprising the steps of:

a) searching for at least a pair of row segments comprising a first row segment used in wiring a first net of the number of nets and a second row segment used in wiring a second net of the number of nets in which said first row segment and said second row segment are situated at least partially within a zone of maximum local density of said channel; and b) shifting said first row segment of said pair in a column direction to said row of said second row segment onto said second wiring layer;

wherein the step of searching comprises:

a1) determining a sub-set of said nets, each of said nets of said sub-set having at least one terminal within said zone of maximum local density;

a2) generating a graph for said nets, each node of said graphs being representative of one of said nets, said step of generating comprising the steps of:

a3) interconnecting said nodes being representative of said sub-set of nets by bi-directional edges;

a4) for each one of said nets:

a5) selecting a leftmost terminal of said one of said nets in a row direction;

a6) interconnecting all nodes being representative of nets having a terminal to the right with respect to said leftmost terminal along said row direction within a column which is intersected by a row segment of said one of said nets to said node being representative of said one of said nets by an unidirectional edge, said unidirectional edge being directed towards said node being representative of said one of said nets;

a7) selecting pairs of said nodes of said graph which are only interconnected by one unidirectional edge;

a8) for each one of said pairs of said nodes:

a9) selecting said row segment of said net being represented by said node of said one of said pairs of nodes from which said unidirectional edge originates as a first row segment and selecting said row segment of said net being represented by said other node of said one of said pairs of nodes as a second row segment.

6. The program storage device according to claim 5 said method further comprising the steps of:

b1) for each one of said pairs of said nodes found in step 7a):

b2) generating an additional graph based on a vertical constraint graph of said channel, said step of generating comprising the steps of:

b3) selecting said node of said one of said pairs of nodes from which said unidirectional edge interconnecting said nodes of said one of said pairs of nodes originates in said graph;

b4) interconnecting all nodes of said vertical constraint graph being representative of nets having a terminal to the right with respect to said selected node along said row direction within a column which is intersected by a row segment of said one of said nets to said selected node by an unidirectional edge for each such terminal;

b5) interconnecting all nodes to which said other node of said one of said pairs of nodes is connected in said vertical constraint graph to said selected node by the same kind of said edges as said other node;

b6) selecting said additional graph if it has no bi-directional edges; and b7) if said additional graph is selected in step b6), selecting a row segment of said net being represented by said selected node as said first row segment and a second row segment of said net being represented by said other node as said second row segment.

7. An electronic device having a channel, said channel comprising rows and columns and a routing of a number of nets in said rows for wiring a number of nets is said rows and columns, said channel having a first wiring layer for said rows and a second wiring layer for said columns, said routing being optimized in accordance with a method comprising the steps of:

a) searching for at least a first row segment used in wiring a first net of the number of nets and a second row segment used in wiring a second net of the number of nets in which said first row segment and said second row segment are situated at least partially within a zone of maximum local density of said channel; and b) shifting said first row segment in a column direction to said row of said second row segment and onto said second wiring layer; wherein the step of searching comprises:

a1) determining a sub-set of said nets, each of said nets of said sub-set having at least one terminal within said zone of maximum local density;

a2) generating a graph for said nets, each node of said graphs being representative of one of said nets, said step of generating comprising the steps of:

a3) interconnecting said nodes being representative of said sub-set of nets by bi-directional edges;

a4) for each one of said nets:

a5) selecting a leftmost terminal of said one of said nets in a row direction;

a6) interconnecting all nodes being representative of nets having a terminal along said row direction within a column which is intersected by a row segment of said one of said nets by an unidirectional edge, said unidirectional edge being directed towards said node being representative of said one of said nets;

a7) selecting pairs of said nodes of said graph which are only interconnected by one unidirectional edge;

a8) for each one of said pairs of said nodes:

a9) selecting said row segment of said net being represented by said node of said one of said pairs of nodes from which said unidirectional edge originates as a first row segment and selecting said row segment of said net being represented by said other node of said one of said pairs of nodes as a second row segment.

8. The electronic device according to claim 7, said method further comprising the steps of:

b1) for each one of said pairs of said nodes found in step a7):

b2) generating an additional graph based on a vertical constraint graph of said channel, said step of generating comprising the steps of:

b3) selecting said node of said one of said pairs of nodes from which said unidirectional edge interconnecting said nodes of said one of said pairs of nodes originates in said graph;

b4) interconnecting all nodes of said vertical constraint graph being representative of nets having a terminal to the right with respect to said selected node along said row direction within a column which is intersected by a row segment of said one of said nets to said selected node by an unidirectional edge for each such terminal; and b5) interconnecting all nodes to which said other node of said one of said pairs of nodes is connected in said vertical constraint graph to said selected node by the same kind of said edges as said other node;

b6) selecting said additional graph if it has no bi-directional edges; and b7) if said additional graph is selected in step b6), selecting a row segment of said net being represented by said selected node as said first row segment and a row segment of said net being represented by said other node as said second row segment.

* * * * *